(12) United States Patent
Platzgummer et al.

(10) Patent No.: US 8,278,635 B2
(45) Date of Patent: Oct. 2, 2012

(54) GLOBAL POINT SPREADING FUNCTION IN MULTI-BEAM PATTERNING

(75) Inventors: Elmar Platzgummer, Vienna (AT); Heinrich Fragner, Vienna (AT); Stefan Cernusca, Innermanzing (AT)

(73) Assignee: IMS Nanofabrication AG, Vienna (AT)

( * ) Notice: Subject to any disclaimer, the term of this patent is extended or adjusted under 35 U.S.C. 154(b) by 63 days.

(21) Appl. No.: 12/708,737

(22) Filed: Feb. 19, 2010

(65) Prior Publication Data

US 2010/0224790 A1  Sep. 9, 2010

(30) Foreign Application Priority Data

Mar. 9, 2009 (EP) .................................... 09450052

(51) Int. Cl.
*H01J 3/26* (2006.01)

(52) U.S. Cl. ............. 250/492.22; 250/492.1; 250/396 R (58) Field of Classification Search .... 250/492.1–492.3, 250/396 R–400

See application file for complete search history.

(56) References Cited

U.S. PATENT DOCUMENTS

| | | | | |
|---|---|---|---|---|
| 3,297,870 A * | 1/1967 | Kiley et al. | ................... | 250/389 |
| 4,393,310 A * | 7/1983 | Hahn | ........................... | 250/398 |
| 6,060,711 A * | 5/2000 | Shimizu | ........................ | 250/398 |
| 6,069,363 A * | 5/2000 | Golladay | .................. | 250/396 R |
| 6,472,673 B1 * | 10/2002 | Chalupka et al. | ........ | 250/492.22 |
| 6,815,693 B2 * | 11/2004 | Kamijo et al. | ............ | 250/491.1 |
| 6,838,668 B2 * | 1/2005 | Berger et al. | ..................... | 850/9 |
| 7,105,843 B1 * | 9/2006 | Pearl | ........................ | 250/492.22 |
| 7,385,197 B2 * | 6/2008 | Nakasuji et al. | ............. | 250/310 |
| 7,474,972 B2 * | 1/2009 | Pickerd et al. | .................. | 702/75 |
| 2003/0022077 A1 * | 1/2003 | Katsap et al. | ................... | 430/30 |
| 2004/0065826 A1 * | 4/2004 | Berger et al. | ................. | 250/310 |
| 2004/0069957 A1 * | 4/2004 | Menon et al. | .............. | 250/492.2 |
| 2005/0006601 A1 * | 1/2005 | Muraki et al. | ........... | 250/492.22 |
| 2005/0012050 A1 * | 1/2005 | Shemesh | ..................... | 250/491.1 |
| 2005/0104013 A1 * | 5/2005 | Stengl et al. | ............. | 250/492.21 |
| 2005/0242302 A1 | 11/2005 | Platzgummer et al. | | |
| 2007/0228293 A1 * | 10/2007 | Ogasawara | ................. | 250/492.3 |
| 2008/0017807 A1 * | 1/2008 | Nagae et al. | ................... | 250/400 |
| 2008/0073575 A1 * | 3/2008 | Dzengeleski | ............ | 250/492.21 |
| 2008/0099693 A1 * | 5/2008 | Platzgummer | ................ | 250/398 |
| 2008/0203317 A1 * | 8/2008 | Platzgummer et al. | ... | 250/396 R |

(Continued)

FOREIGN PATENT DOCUMENTS

WO  03052516 A1  6/2003

(Continued)

*Primary Examiner* — Robert Kim
*Assistant Examiner* — Wyatt Stoffa
(74) *Attorney, Agent, or Firm* — Sutherland Asbill & Brennan LLP (57) ABSTRACT

In a particle multi-beam structuring apparatus for forming a pattern on a target's surface using a beam of electrically charged particles, during exposure steps the particle beam is produced, directed through a pattern definition means producing a patterned particle beam composed of multiple beamlets, and projected by an optical column including a controllable deflection means onto the target surface to form, at a nominal location on the target, a beam image comprising the image of defining structures in the pattern definition means. The beam image's nominal location relative to the target is changed between exposure steps. The actual location of the beam image is varied within each exposure step around the nominal location, through a set of locations realizing a distribution of locations within the image plane around a mean location coinciding with the nominal location, thus introducing an additional blur which is homogenous over the entire beam image.

10 Claims, 4 Drawing Sheets

U.S. PATENT DOCUMENTS

| | | | |
|---|---|---|---|
| 2008/0230711 A1* | 9/2008 | Platzgummer et al. | 250/396 R |
| 2008/0237460 A1* | 10/2008 | Fragner et al. | 250/307 |
| 2009/0146082 A1* | 6/2009 | Stengl et al. | 250/492.22 |
| 2009/0173887 A1* | 7/2009 | Ito et al. | 250/396 ML |
| 2009/0261267 A1* | 10/2009 | Wieland et al. | 250/396 R |
| 2010/0019172 A1 | 1/2010 | Yamada et al. | |
| 2010/0124722 A1* | 5/2010 | Fragner et al. | 430/296 |
| 2010/0127185 A1* | 5/2010 | Fragner et al. | 250/398 |
| 2010/0224790 A1* | 9/2010 | Platzgummer et al. | 250/400 |
| 2010/0294954 A1* | 11/2010 | Gates et al. | 250/492.1 |

FOREIGN PATENT DOCUMENTS

| | | |
|---|---|---|
| WO | 2008117398 A1 | 10/2008 |

\* cited by examiner

GLOBAL POINT SPREADING FUNCTION IN MULTI-BEAM PATTERNING

FIELD OF THE INVENTION AND DESCRIPTION OF PRIOR ART

The present invention relates to a method for forming a pattern on a surface of a target by means of a beam of electrically charged particles. More in detail, the method comprises the steps of: producing said particle beam; directing said particle beam through a pattern definition producing a patterned particle beam; and projecting this patterned particle beam by means of an optical column comprising a controllable deflection means onto said target surface to form, at a nominal location on the target, a beam image. The beam image thus is made up by the image of defining structures in the pattern definition means. In a sequence of (preferably, uniformly timed) exposure steps the location of said beam image is changed such that it is at different locations, respectively, by changing the nominal location of the beam image with respect to the target between exposure steps.

A particular maskless particle multi-beam processing apparatus of this kind is disclosed in U.S. Pat. No. 7,084,411 of the applicant/assignee as discussed in the following.

Processing of planar targets by means of electrically charged particles has been investigated since the 1980s. One important application of particle-beam lithography is in semiconductor technology. Therein, lithography apparatus are used to define structures on a target, e.g. a silicon wafer. (Throughout this disclosure, the terms target and substrate are used interchangeably.) In order to define a desired pattern on a substrate wafer, the wafer is covered with a layer of a radiation sensitive photoresist. Afterwards, a desired structure is imaged onto the photoresist by means of a lithography apparatus, and the photoresist is then patterned by partial removal according to the pattern defined by the previous exposure step and then used as a mask for further structuring processes such as etching. In another important application the pattern may be generated by direct patterning without a resist, for example ion milling or reactive ion beam etching or deposition.

In this disclosure, the term 'multi-beam' refers to a setup exploiting a charged particle beam consisting of a plurality of sub-beams (called "beamlets"), which are dynamically structured from the illuminating particle beam by an aperture plate including switchable blanker devices. In a maskless multi-beam apparatus, the feature shapes are defined on a target by means of such an array of beamlets through the amount of exposure dose imparted to each pixel. Each beamlet is switched on or off according to a desired pattern, and the beamlets are moved over the target. In the course of subsequent exposure steps, the desired layout is composed on the target. For instance, with a resist-based method, if a pixel receives an exposure dose exceeding the (given) resist-development threshold, that pixel is exposed; otherwise the pixel is not exposed. The feature shape is thus defined by the spatial distribution of exposed and non-exposed pixels.

The layout data is usually generated in polygonal structures. For the exposure of resist images by means of a maskless pattern writing tool the layout date is converted into a pixel image data (rasterization). Therefore, the technology for maskless tools requires specific methods for data preparation. One feature of the maskless tool concept is that each pixel requires the same amount of time regardless of whether it is exposed or not.

In 1997, I. L. Berry et al., in J. Vac. Sci. Technol. B, 15(6), 1997, pp. 2382-2386, presented a writing strategy based on a blanking aperture array and an ion projection system. Arai et al., in U.S. Pat. No. 5,369,282, discuss an electron beam exposure system using a so called blanking aperture array (BAA) which plays the role of a pattern definition means. The BAA carries a number of rows of apertures, and the images of the apertures are scanned over the surface of the substrate in a controlled continuous motion whose direction is perpendicular to the aperture rows. The rows are aligned with respect to each other in an interlacing manner to that the apertures form staggered lines as seen along the scanning direction. Thus, the staggered lines sweep continuous lines on the substrate surface without leaving gaps between them as they move relative to the substrate, thus covering the total area to be exposed on the substrate.

Starting from Berry's concept, E. Platzgummer et al., in U.S. Pat. No. 6,768,125 and U.S. Pat. No. 7,084,411, presented a multi-beam direct write concept dubbed PML2 (short for "Projection Maskless Lithography"), employing a pattern definition system (PD system) comprising a number of plates stacked on top of the other, among them an aperture array means and a blanking means. These separate plates are mounted together at defined distances, for instance in a casing. The aperture array means has a plurality of apertures of identical shape defining the shape of beamlets permeating said apertures, wherein the apertures are arranged within a pattern definition field composed of a plurality of staggered lines of apertures, wherein the apertures are spaced apart within said lines by a first integer multiple of the width of an aperture and are offset between neighboring lines by a fraction of said integer multiple width. The blanking means has a plurality of blanking openings arranged in an arrangement corresponding to the apertures of the aperture array means, in particular having corresponding staggered lines of blanking openings.

The teachings of U.S. Pat. No. 6,768,125 and U.S. Pat. No. 7,084,411 of the assignee/applicant, concerning the architecture and operation of a PML2 lithography apparatus, in particular with regard to the PD device, are hereby included as part of this disclosure by reference.

The PML2 multi-beam direct write concept allows for a large enhancement of the writing speed compared to single beam writers. This arises from the reduction of the required current density, the diminished importance of space charge due to the large cross section, the enhanced pixel transfer rate due to the parallel writing strategy, and the high degree of redundancy possible using a plurality of beams.

The key technology for an addressable mask is the so-called MEMS ("Micro-Electro and micro-Mechanical System") technology, which allows the monolithic fabrication of a huge number, such as hundred thousands up to millions, of apertures together with the needed electronics for beam switching and data management. Since the minimum feature size of industrial MEMS devices is in the micrometer range, which is much larger than the typical critical dimension in lithography (for example, the size of apertures and micro-deflectors), a powerful large-field high-resolution optical projection system is obligatory for exploitation of the advanced MEMS fabrication technologies in the field of lithography or direct nano patterning, as realized in the maskless lithography systems of PML2.

The main advantage of the PML2 multi-beam direct write concept is the large enhancement of the writing speed compared to single beam writers. The improved productivity mainly arises from the following circumstances:

the need for an extremely high current density at the substrate is significantly relaxed (relaxed source requirement)

the required single beam blanking rate can be limited to the low MHz regime or upper kHz regime the importance of space charge is reduced (current is distributed to a large cross section when a broad beam is used)

enhanced pixel transfer rate due to parallel writing strategy (instead sequential raster scan)

high degree of redundancy is possible (usable for example for gray scale generation or to achieve a very fine address grid)

However, in order to establish multi-beam patterning for industrial purposes, there are several challenges:

All beams are to have the same dose (i.e. the number of particles transmitted in each beam per pixel exposure) within a narrow tolerance.

All beams are to have the same shape; if the shape is not quite correct, at least the dose integral of each beam should be the same within a narrow tolerance.

All beams are to be positioned on the substrate on a highly regular grid. This requires an imaging with almost fully eliminated distortions and with full control of current-dependent image distortion and de-focusing.

The above three issues and pertaining improvements are the subject of another patent application of the inventors, European patent application No. 08450121. The present invention addresses a different challenge, namely:

All beams are to have corresponding dose distribution functions, or in other words, the same aerial image (again, within a narrow tolerance only).

The aerial image that a beamlet generates on the target is a result of the 2D shape of the object imaged to the target (i.e., the aperture in the PD system), convoluted with a point spreading function (PSF). The PSF is defined as the image which a point of the PD system will produce at the target. In general, the PSF may take individual shaping for each point location at the PD system; this, however, is highly undesirable, and ideally the PSF should be uniform over the PD system. Only if the aerial image of all individual beamlets is sufficiently equal, different beams give rise to the same line edge position and critical dimension (CD) on the substrate. Only then, also the sum and superposition of such beams is independent from the position of beams that are used to generate the lithographic pattern. This is of great importance for the data preparation for the beam patterning, which cannot consider individual beam properties such as the local PSF in order to avoid an mathematically involved and time-consuming calculation.

The imaging PSF is a major factor for determining the size and shape of the dose distribution generated and transferred to the substrate during the multi-beam patterning process. It is typically dominated by the blur of the imaging system, including all non-ideal imaging contributions. Usually, the PSF in a charged particle optical system, such as the PML2 system, is substantially of the type of a Gaussian function, in other words, every object point is imaged on the substrate as a distribution which closely resembles a Gaussian distribution. Consequently, a rectangular shape, as for example a square aperture of the blanking aperture plate of the PD system, is imaged as a 2D error function. A detailed description of the term PSF in the context of projection lithography is given in the article of D. F. Kyser, N. S. Viswanathan, J. Vac. Sci. Technol., 12 (6), 1975, p. 1305.

According to current state of the art, typically a chemically amplified resist is used in lithography, in particular for mask writing with electron beams. During processing this resist typically undergoes a lateral acid diffusion process, which has the effect of a "diffusion blur", which causes an additional contribution to the effective PSF. It is worthwhile to mention that this diffusion-related PSF has generally a larger range than the tool-related PSF. Therefore, variations of the former may be largely dominant over the latter, so tool-related PSFs are often of less importance in the developed resist pattern.

In this context, the mathematical fact is recalled that Gaussian spreads superpose with regard to the square of the half-width (which we here denote by $\sigma$, the Greek letter 'sigma'): If a first Gaussian having a half-width $\sigma_A$ is convoluted with a second Gaussian having a half-width $\sigma_B$, then the half width $\sigma$ of the resulting distribution (which then also has Gaussian shape) equals $\sigma=\sqrt{(\sigma_A^2+\sigma_B^2)}=\sigma_B\sqrt{(1+(\sigma_A/\sigma_B)^2)}$.

In practice this means that if the resist process related diffusion blur is much larger than the tool-related blur, it will dominate the pattern formed on the resist, independently of any variation in the tool-related blur. The disadvantage of the diffusion blur is that this blur is quite large (i.e., having a large $\sigma$ of the diffusion-related PSF) and that therefore the image contrast (which is reflected by the dose slope near resist threshold level; in most cases, the resist threshold level is the 50% contour) is significantly reduced.

A notable feature of Gaussian PSFs is that the 50% contour is virtually independent on the blur (under the condition that the blur is small compared to the feature size). Therefore, the intensity of the beam (and consequently, the beamlets defined by it) is preferably chosen such that the 50% level of the maximal dose coincides with the resist threshold level. This will have the pattern not depend on the actual value of the blur.

However, the effective PSF (which does depend on the blur) has an important influence on the slope of the dose near the threshold dose level and, therefore, on the final edge position after resist development. Generally, any deviation in dose slope may lead to imaging errors, which may become significant when a realistic process window is considered and the development time or resist sensitivity has to be assumed as non-ideal. These factors may influence the shape of features produced on the target, and cause undesired distortions.

In order to avoid a detrimental effect of the dose slope on resist development, the size and shape of the blur and related PSF of the beamlets in a multi-beam setup are required to be homogeneous to a large extent. In other words, the effective blur, and in particular the tool-realted blur, is required to be independent on the position of the image the beamlet produces in the image field on the target (which is equivalent to, or defined by, the position of the beamlet in the array of beamlets). Furthermore, it is desired that the individual PSFs related to the respective beamlets be isotropic, i.e., the spatial distribution is only a function of the distance from the center and not depending on the direction.

An example for a non-isotropic PSF would be the case of an chromatic blur in an optical system comprising round electrostatic lenses. In such a case the energy spreading is trans-ferred to a radial (also referred to as "sagittal") width of the PSF, whereas the tangential (also referred to as "meridional") width is unchanged.

Generally, in case where a multi-beam array is imaged by one common projection system, the blur and related PSF due to optical aberrations will tend to significantly vary over the image field and show a non-isotropic behavior. In such systems, at certain positions in the image field, the radial width of the PSF will be different from the tangential width.

Furthermore, the blur due to Coulomb interaction scales with the amount of current through the optical column, so it will scale with the pattern density to be patterned. Variable pattern density will lead to variable blur, namely, variable in time and variable also across the image field. This is due to the fact that the Coulomb related interaction shows a dependence on the radial position and, in case of a pattern having a non-homogenous density of active pixels, also on spatial position within the image field.

In some cases the center of the image field has a blur which is much smaller than near the edge of the image field (a typical situation for geometric aberration errors); or near the edge of the image field the radial component of the blur is much larger than the tangential component (typical for chromatic aberration or focus instability). Generally, the blur distribution over the image field will be a complex function which depends on a multitude of parameters such as the adjustment of the lenses, design of the optics, higher order imaging errors, and other disturbances such as noise, lens alignment errors, illumination homogeneity errors and pattern-dependent effects.

In particular, mechanical vibration (which may be directed along the mechanical scanning axis or orthogonal to it), motion blur or non-isotropic noise in the beam deflection system may cause additional blur contributions which may give rise to non-isotropic blur. Non-isotropic noise may be due to various reasons, among them, in the case of a PML2 setup, the scanning motion of the mechanical stage where the beam is scanned predominantly along one direction.

SUMMARY OF THE INVENTION

It is an object of the present invention to improve the control of the PSF, i.e., the function which defines the spatial distribution of intensity (or particle density) generated on the substrate by one object point. This will ensure better stability of the structures imaged on the target. Furthermore, it is desired to find a way to deal with non-isotropic and/or asymmetric PSFs in a multi-beam imaging system such as a PML2 apparatus.

This objective is met by a method as described in the beginning, wherein within the duration of an exposure step controllable deflection means are used to vary the actual location of the beam image around the nominal location respective to the exposure step, through a set of locations realizing a distribution of locations within the image plane centering around a mean location coinciding with the nominal location. This distribution can be substantially isotropic, in particular if the existing blur does not contain any anisotropic (directionally oriented) component.

This solution effectively introduces an additional blur which is equivalent to a global PSF uniform to all beamlets. Therefore, over the image field all individual PSFs, relating to the different beams within the multi-beam array, are convoluted by the same global PSF. The global PSF has typically a greater width than all individual PSFs. Preferably, the global PSF is at least two times the lowest individual PSF. This method allows a reduction of the differences in PSF by increasing the width of all individual PSFs by a controlled amount. The additional blur is procured by components provided in the particle-optical system, and does not require any modifications of the PD system of the multi-beam apparatus.

This approach provides a method for controlling the level of beam uniformity needed to correctly compose a larger pattern by a plurality of small beam shapes, such that the resulting line edge positions and the CD are independent from the individual PSFs.

The diffusion blur helps to homogenize the pattern. At the same time it decreases contrast, which may cause again pattern errors or roughness due to process variations, such as resist inhomogeneity, handling of resist, aging of resist during exposure, accuracy of development time. The global PSF according to the invention offers an adjustable half-width as an additional processing parameter which can be controlled by the tool operator and can be optimized with respect to optimum performance of tool and resist. For very small imaging blur the global PSF can be chosen in a way that the resulting blur $\sigma'$ is as small as possible to achieve the best possible imaging contrast. In contrast, any non-isotropic behavior or variation of the PSF within the beam array, for example a difference in the widths of distribution taken for the X and Y directions, could cause significant edge position errors which deteriorates pattern fidelity and stitching accuracy. The invention helps to reduce PSF anisotropy and the resulting undesired effects.

A particular application of the invention relates to the PML2 architecture, in which the target is moving relative to the pattern definition means along a scanning direction within an image plane in which the images of apertures are formed. In this case, the nominal location of said beam image is, by means of said at least one controllable deflection means, moved along with the target during each exposure step, at least with respect to the relative target movement along the scanning direction, whereas between exposure steps the nominal location of the beam image is changed with respect to the target. Furthermore, in this case, preferably, the following measures are realized: The step of directing said particle beam through a pattern definition means is performed using a pattern definition means comprising an aperture array having a plurality of regularly arranged apertures of identical shape, said step comprising producing a number of beamlets by means of said apertures which define the shape and relative position of said beamlets, and modifying selected beamlets by means of a blanking array means of the pattern definition means towards respective paths which do not meet the target, thus effectively switching off the passage of said selected beamlets, the remaining beamlets forming, as a whole, a patterned particle beam. Also, the step of projecting the patterned particle beam onto said target surface, the beam image thus formed is composed of the images of the apertures whose beamlets are not switched off, with each aperture corresponding to an image element on the target surface. Moreover, in order to simplify the calculation of patterns, the sequence of exposure steps preferably comprises a sequence of uniformly timed exposure steps.

According to an advantageous development of the invention, a location generator may be used to generate the set of locations defining the global PSF. The location generator produces a sequence of locations in a plane centered around the origin, and said sequence is superposed to the current nominal position. The location generator may, for instance, be realized as a random generator, such as a noise generator, or as a digital generator producing a set of digital locations approximating a two-dimensional Gauss distribution.

As an alternative, the set of locations may be supplied from a fixed list, which comprises a sequence of locations in a plane centered around the origin, and said set of locations is superposed to the current nominal position.

Preferably, in particular in connection with a PML2 setup as explained above, the exposure steps each may have a duration within which the relative movement of the target covers a uniform distance of advance which is greater than the mutual distance of neighboring image elements on the target.

BRIEF DESCRIPTION OF THE DRAWINGS

In the following, the present invention is described in more detail with reference to the drawings, which show.

DETAILED DESCRIPTION OF THE INVENTION

The preferred embodiment of the invention discussed in the following is based on the PML2-type particle-beam exposure apparatus with a PD system as disclosed in U.S. Pat. No. 6,768,125 and U.S. Pat. No. 7,084,411 of the assignee/applicant, and with a large-reduction projecting system. In the following, first the technical background of the apparatus is discussed—as far as relevant to the invention—, then the invention is presented in detail.

It should be appreciated that the invention is not restricted to the following embodiments or the particular layout of the PD system, which merely represent one of the possible applications of the invention; the invention is suitable for other types of processing systems that employ a particle-beam with projector stages as well.

Figure 1:
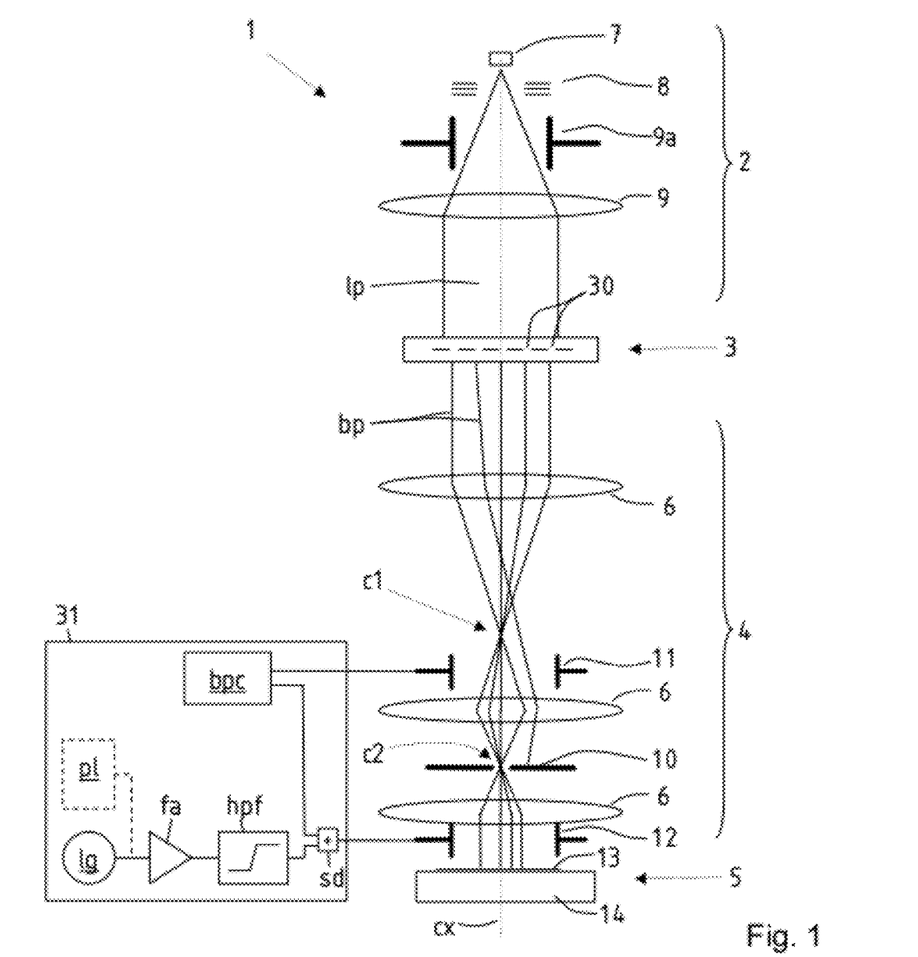
FIG. 1 shows a schematic overview of a particle-beam exposure apparatus in a longitudinal section according to an embodiment of for the invention.

FIG. 1 shows a schematic overview of a maskless particle-beam processing apparatus PML2 according to an embodiment of the invention. The components are not shown to size; in particular, the lateral width of the particle beam lb, pb is exaggerated with respect to the size of the apparatus. In the following, only those details are given as needed to disclose the invention. For more details, the reader is referred to U.S. Pat. No. 6,768,125 and U.S. Pat. No. 7,084,411.

The main components of the lithography apparatus 1—corresponding to the direction of the lithography beam lb, pb which in this example runs vertically downward in FIG. 1—are an illumination system 2, a PD system 3, a projecting system 4, and a target station 5 with a substrate 13 which is held and positioned by a wafer stage 14. The whole apparatus is contained in a vacuum housing (not shown) held at a high vacuum to ensure an unimpeded propagation of the beam lb, pb along the optical axis cx of the apparatus. The optical systems 2, 4 are realized using electrostatic or electromagnetic lenses which are depicted symbolically by reference numbers 6, 9.

The illumination system 2 comprises, for instance, an electron gun 7, an extraction system 8 as well as a condenser lens system 9. A general blanking deflector and/or a Wien-type filter, denoted as component 9a, may be present as well. It should, however, be noted that in place of electrons, in general, other electrically charged particles can be used as well. Apart from electrons these can be, for instance, hydrogen ions or heavier ions, charged atom clusters, or charged molecules.

In the context of this disclosure "heavier ions" refer to ions of elements heavier than C, such as O, N, or the noble gases Ne, Ar, Kr, Xe.

By means of the condenser lens system 9, the particles emitted from the illumination system 2 are formed into a wide, substantially telecentric particle beam serving as lithography beam lb. The lithography beam lb then irradiates the PD system 3 which is held at a specific position in the path of the lithography beam lb. The PD system 3 comprises a number of (consecutive parallel) plates which each have a plurality of openings and/or apertures 30 arranged in regular arrays. By means of these aperture a beam pattern is defined which is meant to be projected on the substrate 13.

Some of the apertures and/or openings are "switched on" or "open" so as to be transparent to the incident beam in the sense that they allow the portion of the beam (beamlet) that is transmitted through it to reach the target. The other apertures and/or openings are "switched off" or "closed", in the meaning that the corresponding beamlets cannot reach the target (even though they may leave the PD system 3 and travel through some portion of the projecting system 4); effectively these "switched off" apertures and/or openings are non-transparent (opaque) to the beam. As a consequence, the lithography beam lb is structured into a patterned beam pb, emerging from the PD system 3. The pattern of switched on apertures and/or openings—the only portions of the PD system 3 which are transparent to the lithography beam lb—is chosen according to the pattern to be exposed on the substrate 13. It should be noted that the "switching on/off" of the beamlets usually is realized by a blanking means of a suitable kind provided in one of the plates of the PD system 3: "Switched off" beamlets are deflected off their path (by very small angles) so they cannot reach the target but are merely absorbed somewhere in the lithography apparatus, e.g. by an absorbing plate 10. In FIG. 1 only five beamlets of the patterned beam pb are shown as representatives for an actual large number of beamlets. One of the beamlets is switched off and is absorbed at the absorbing plate 10 while the other four beamlets are directed to the target 13 and there form images of the respective apertures 6.

In the embodiment shown in FIG. 1, the projection system 4 is composed of a number of consecutive particle-optical projector stages, consisting of electrostatic or electromagnetic lenses and other deflection means. These lenses and means are shown in symbolic form only, since their application is well known from prior art. The projection system 4 employs a demagnifying imaging through crossovers c1, c2. The demagnification factor for both stages is chosen such that an overall demagnification of several hundred results, e.g. 200× (we remind that FIG. 1 is not to scale). A demagnification of this order is in particular suitable with a lithography setup, in order to alleviate problems of miniaturization in the PD device.

The PSF of the projection system 4 is typically a distribution which is close to a Gaussian function. Deviations from a Gaussian distribution will usually be present, but they are small and can be neglected within the framework of the present invention. In the whole projection system 4, provisions are made to extensively compensate the lenses and/or deflection means with respect to chromatic and geometric aberrations. As a means to shift the image laterally as a whole, i.e. along a direction perpendicular to the optical axis cx, deflection means 11 and 12 are provided in the projection system 4. The deflection means may be realized as, for instance, a multipole electrode system placed at a suitable position in the projection system 4, such as near a crossover, as shown in FIG. 1 with the first deflection means 11, or after or directly before the final lens of the respective projector, as in the case with the second stage deflection means 12 in FIG. 1, or even within a lens in the case of a magnetic lens (e.g. the final lens). In this apparatus, a multipole electrode is used as deflection means both for shifting the image in relation to the stage motion and for correction of the imaging system in conjunction with the alignment system. These deflection means 11, 12 are not to be confused with the blanking array means of the PD system 3 which are used to switch selected beamlets of the patterned beam pb "on" or "off", since the former deal with the particle beam as a whole while the latter serve to individually modify selected beamlets.

A control system 31 with beam position controller bpc is provided for calculating and generating the electric signals fed to the deflection means 11, 12. The electrical connections for the deflection means 11, 12 shown in FIG. 1 are denoted only symbolically for the sake of clarity. The control system 31 also controls the data preparation and data feed to the PD system 3, but this is not relevant for the present invention and, therefore, was suppressed in FIG. 1.

Suitably, a scanning stripe exposure strategy, where the substrate 13 is moved under the incident beam pb, is utilized. It should be noted that, since different parts of the substrate 13 are to be patterned differently, the number of "switched on" apertures can change quickly when the substrate is moved under the patterned beam. At the same time, the current, i.e. the particles traversing the optical column of the lithography apparatus 1 after the absorbing plate 10, may change considerably.

In one typical implementation, the size of the image of an array of apertures in the PD system 3 on the substrate 13 is 80 μm square. The substrate 13 is moved with a velocity of 3 mm/s underneath the patterned beam; so, a completely new area with a—possibly—different pattern is reached every 30 ms. Consequently, the patterns change in a matter of milliseconds, and the optics of the lithography apparatus 1 have to cope with the changing current, i.e. the changing number of particles crossing the optical column.

According to the PML2 concept, the substrate 13 is moved continuously, and the same image element ("pixel") on the target is covered many times by the images of a sequence of apertures during the same scanning movement. Simultaneously, the pattern in the PD system is shifted, step by step, through the apertures of the PD system. Thus, considering one image element at some location on the target, if all apertures are switched on when they cover that image element, this will result in the maximum exposure: a "white" shade corresponding to 100%. In addition to a "white" shade, it is possible to expose an image element at the target according to a grey scale, namely, with an exposure level which would interpolate between a the minimal ('black') and maximal ('white') exposure doses. A grey shade is realized by switching on a corresponding number of apertures in the line, for example, 8 out of 30 apertures. Thus, the signal controlling the value of an image element is represented by a grey scale code, for example an integer number coded as a binary number of n bits. There may be different numbers of grey shades.

Figure 2:
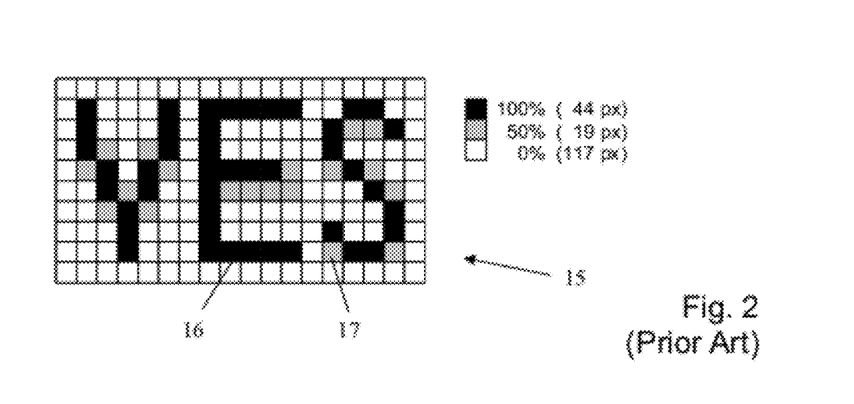
FIG. 2 shows an example of a pixel map of an exemplary layout.

FIG. 2 shows a simple example of an image 15 with a size of 10×18=180 pixels, where some pixels 16 of the exposure area are exposed to a grey level of 100% and other pixels 17 are exposed to only 50% of the full grey level. The remaining pixels are exposed to a 0% dose (not exposed at all). Of course, in a realistic application of the invention, the number of pixels of the standard image would be much higher. However, here the number of pixels is only 180 for the better clarity. Also, in a realistic application more gray levels may be used.

Figure 3:
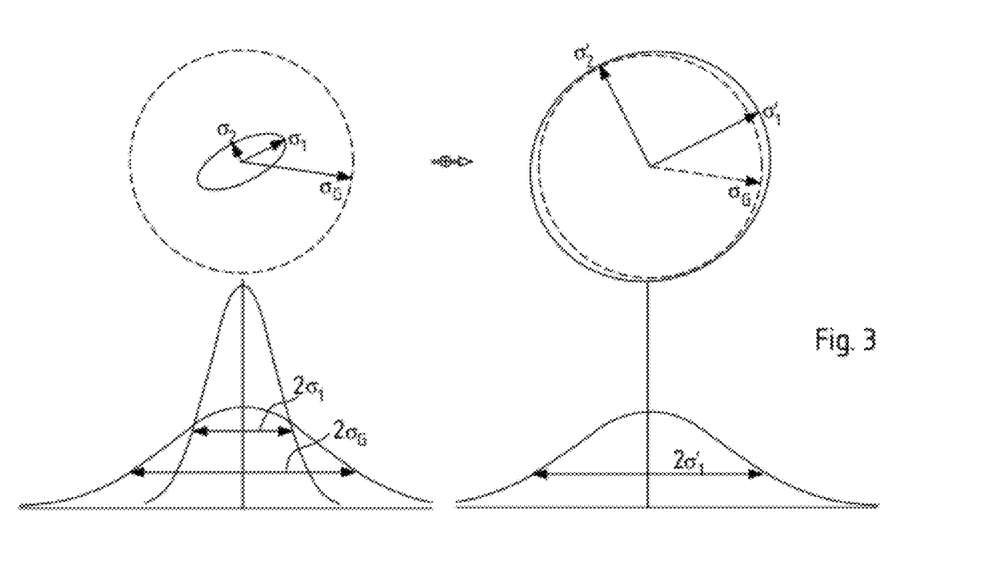
FIG. 3 illustrates the principle of invention, namely, the superposition of a non-isotropic PSF with a global PSF to obtain a resulting PSF which is (almost) isotropic.

FIG. 3 illustrates the principle of the invention. During one exposure step, an image point is formed on the target with a given PSF defined by the characteristics of the imaging system. The PSF causes a certain blur of the point over some region on the target. In the upper drawings of FIG. 3, contour plots are used to denote this spread; in the corresponding lower drawings, the intensity of the dose is depicted as function of the local coordinate. As usual for a contour plot, the contour surrounds the high-amplitude region of the PSF, with the center at the nominal position of the image point. Typically, the PSF contour on the target is substantially elliptic, as shown, with the main axes given by the two main values of sigma, $\sigma_1$ and $\sigma_2$. The corresponding dose intensities, shown below the respective contour plots, display the dose as function of the coordinate on the line oriented along the direction of $\sigma_1$. It should be noted that the elliptic distribution shown here is an idealization; in realistic applications, there are (albeit small) deviations from an elliptic distribution which can be described by a multi-pole composition including components of higher than second order. Such deviations are usually sufficiently small so they can be neglected, and are not considered further in the following.

The PSF shown here is of substantially Gaussian type, which is, as already mentioned, realized in most practical cases to sufficient approximation. It is recalled that a Gaussian distribution G obeys the relation $$G(x)=G(0)\cdot\exp(-(d/\sigma)^2),$$

wherein d is the distance from the center of the distribution. At d=0 (i.e., the center) the distribution has its maximum value G(0) (which could be normalized to 1 if so preferred), whereas at d=σ the distribution decreases to a value of G(0)/e=0.368 G(0). The parameter σ is the square-root of the statistical variance of the distribution (standard deviation); it denotes the half-width of the distribution, and is also referred to as "sigma" in this disclosure.

An alternative definition of the half-width parameter could be with regard to the half-width of half-maximum (HWHM), s. With the HWHM which the Gaussian function writes $G(x)=G(0)\cdot\exp(-(\ln 2)(d/s)^2)$. Use of the HWHM may be of advantage when the resist threshold level is the 50% contour. The HWHM is equivalent with the sigma defined above as the standard deviation except for a constant factor, since $s=\sigma\cdot\sqrt{\ln 2}=0.833\sigma$. Because of this immediate relation, the HWHM may be used in place of sigma without any change to the present invention.

Furthermore, the mathematical fact is recalled that Gaussian distributions superpose with regard to the square of sigma: A combination of a Gaussian distribution having a sigma $\sigma_L$ with another Gaussian of sigma $\sigma_G$ will give a distribution of Gaussian character again. The resulting distribution (mathematically defined by the convolution of the two partial distributions) has a sigma $\sigma'=\sqrt{(\sigma_L^2+\sigma_G^2)}$. In the case that one of the partial sigmas is considerably larger than the other, (in particular, $\sigma_L<<\sigma_G$), the resulting half-width $\sigma'$ becomes almost equal to the larger partial sigma ($\sigma'\approx\sigma_G(1+(\sigma_L/\sigma_G)^2/2)\approx\sigma_G$).

Returning to FIG. 3, according to the invention, an additional spread is applied to the PSF, which corresponds to an additional spread with a sigma $\sigma_G$. For reasons which are explained below, this additional spread is referred to as global spread, and the corresponding half-width as global sigma. In FIG. 3 it is denoted by a dashed contour, which in the example shown is a circle since it is independent of the direction. This global PSF is superposed to the intrinsic PSF. As mentioned in the introductory section, Gaussian spreads superpose with regard to the square of the sigma, so resulting spread has shape which is characterized by the two main sigmas $\sigma_1'$ and $\sigma_2'$, with $\sigma_1'=\sqrt{(\sigma_1^2+\sigma_G^2)}$ and $\sigma_2'=\sqrt{(\sigma_2^2+\sigma_G^2)}$.

A measure to describe the anisotropy of the PSF is given by ratio of the maximum and minimum sigma of the imaging related PSF within the image field. From the above it is easy to see that the invention reduces the ratio $\sigma_1/\sigma_2$ by the relation $$\sigma_1/\sigma_2 \to \sigma_1'/\sigma_2' = \sqrt{([1+(\sigma_1/\sigma_G)^2]/[1+(\sigma_2/\sigma_G)^2])}$$

where, $\sigma_1'$ and $\sigma_2'$ are the minimum and maximum sigma values of the combined PSF distribution. This shows that the introduction of a global PSF helps to reduce anisotropic spreads considerably.

Assuming, for example, an ensemble with varying local PSFs in which the higher sigma $\sigma_1$ is 6 nm and the lower sigma $\sigma_2$ is 4 nm, then a global sigma $\sigma_G$=12 nm reduces the ratio of sigma from 3/2=1.50 to 1.06. This would mean the significant reduction of the anisotropy caused by the dose slope from 50% to 6%. A global sigma of 18 would reduce the anisotropy of the same ensemble to 1.04, i.e. from 50% to 4%. A global sigma of 12 or 18 nm is still smaller compared to the sigma of the diffusion-related blur, which is typically above 20 nm in VSB systems using a chemically amplified resist.

Figure 4:
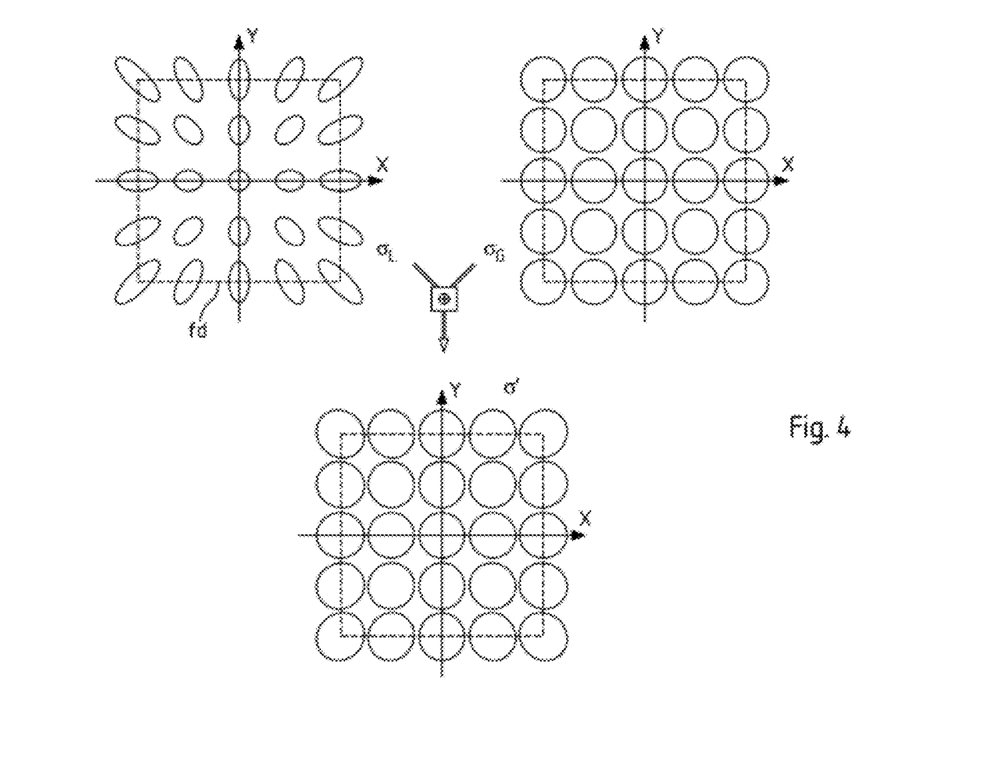
FIG. 4 shows PSF charts showing the superposition of PSFs for a complete image field; an original PSF (left chart) with varying sigma is superposed with a uniform global PSF (right chart) to obtain a resulting PSF (bottom chart)

FIG. 4 shows the working of the principle explained above with FIG. 3 when applied to a complete image field fd (i.e., the image as produced on the target by the apparatus 1) for the exposure of a set of image points at one exposure step. The image field fd is shown in three versions where the PSF for several locations are shown. Each of the three charts, called PSF charts, illustrates the behavior of the PSF across the image field fd on the target, with regard to the local sigma $\sigma_L$, the global sigma $\sigma_G$, and the combined sigma $\sigma'$, respectively. In each of the PSF charts, the spread of the PSF is denoted by a contour like in the upper drawings of FIG. 3, and the contours are respectively centered at the locations within the image field fd for which the contours are valid. Only the contours for 5×5 positions in the image field fd are shown for better clarity, as the actual number of image points within the image field will be considerable, e.g. several hundreds or thousands. Furthermore, it is assumed here that the positions of the image points are arranged according to a regular rectangular array; in other embodiments, an alternate arrangement, such as a skewed or staggered array, may be present without departing from the present invention.

The first chart for $\sigma_L$, in the upper left corner of FIG. 4, depicts a typical case of a radially dependent PSF as known from prior art. The minimum sigma is generally in the meridional direction and almost uniform, whereas the maximum sigma is along the radial direction and clearly changes with the radius; usually it grows with increasing radius. The second chart, indicated with $\sigma_G$ (upper right corner of FIG. 4) illustrates the uniform spread ("global spread") added throughout the image field fd. The result of the combination of these two spreads is shown in the PSF chart denoted $\sigma'$ in the lower part of FIG. 4. The contours still have elliptic shape, but the difference from circles is only clear on closer inspection. This demonstrates that the anisotropy of the PSF is largely reduced.

Figure 5:
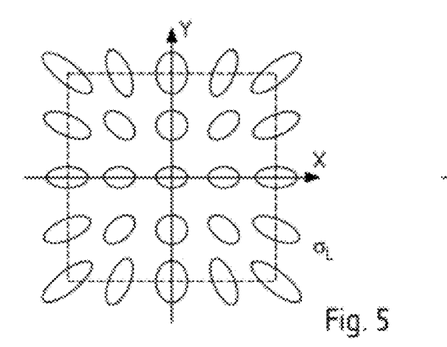
FIG. 5 shows an example of a PSF chart with an additional directional distortion along the X-axis.

FIG. 5 illustrates a special case in which a directional blur contribution is present in the local PSF. This blur contribution may, for example, be caused by an enhanced noise along the mechanical scanning direction (in FIG. 5, the X direction), due to band width limitations in beam tracking. In order to compensate this directional blur, the global PSF can be "distorted" along this axis to correct for the related errors as illustrated in FIG. 6.

Figure 6:
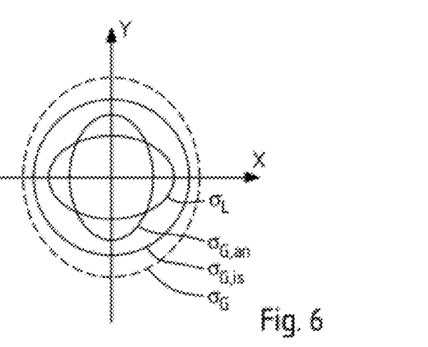
FIG. 6 illustrates the use of a non-isotropic global PSF to compensate a directional distortion as shown in FIG. 5.

FIG. 6 shows PSF contours at the origin position of FIG. 5. The local PSF, denoted by $\sigma_L$, display an enlarged sigma along the X direction. In combination with an isotropic global sigma (denoted by $\sigma_{G,is}$) as described above in relation to FIG. 4, a non-isotropic global blur $\sigma_{G,an}$ is introduced which specifically compensates. The global PSF is thus described by the contour $\sigma_G$, which is the combination of the two contributions $\sigma_{G,is}$ and $\sigma_{G,an}$.

Figure 7:
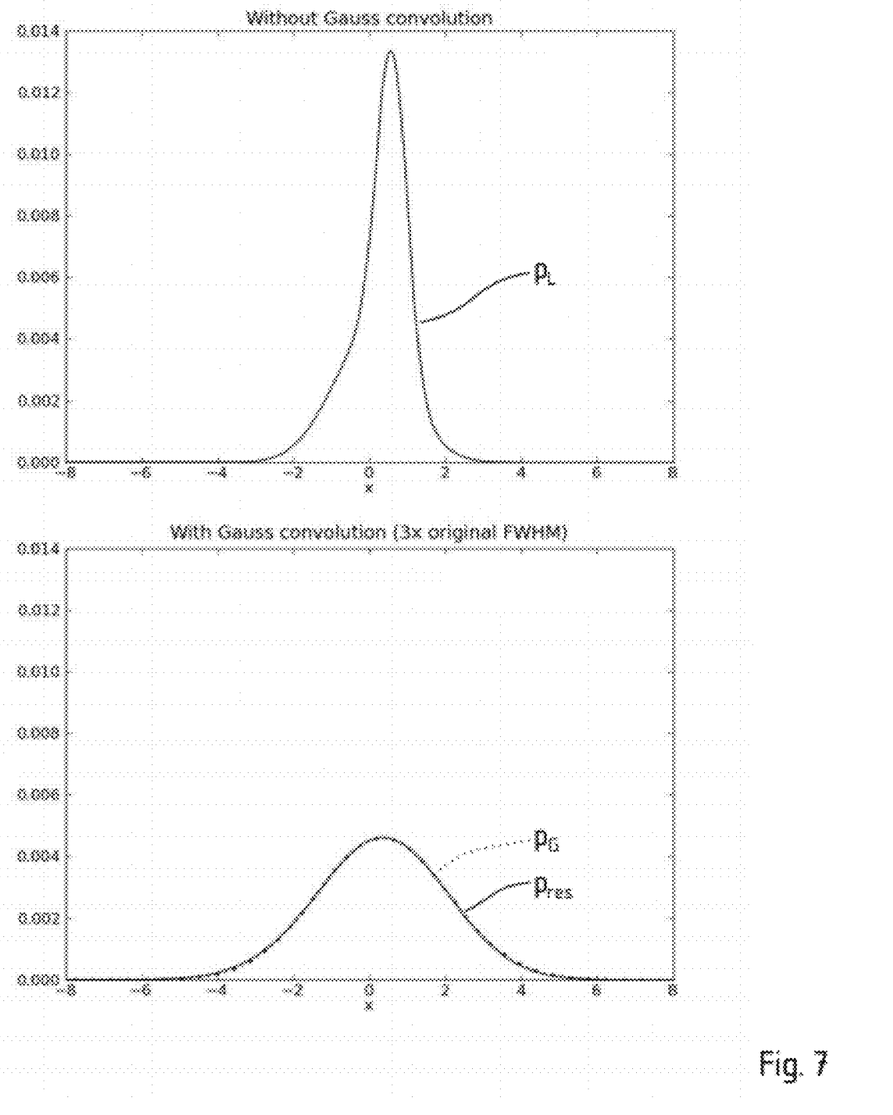
FIG. 7 shows the "conditioning" of a distorted PSF which strongly deviates from a Gaussian distribution.

FIG. 7 illustrates another major advantage of the invention, relating to a local PSF deviating from a Gaussian. The deviation of the local PSF from an ideal Gaussian spread may be in that it is non-symmetric or by having higher order weights ("distortions"). The upper frame of FIG. 7 depicts a PSF, denoted $p_L$, that exhibits a marked distortion which renders the PSF visibly deviating from a Gaussian, as one example out of many that the person skilled in the art can readily provide. According to the invention, the PSF $p_L$ is convoluted with a global Gaussian PSF $p_G$ (illustrated by dots in the lower frame) having the triple sigma of the distorted PSF $p_L$; the lower frame shows the resulting PSF distribution $p_{res}$ (solid line) which is sufficiently close to an ideal Gaussian distribution.

The correction of distorted PSFs is particularly important in the case where the individual beamlets exhibit PSFs with different distortions, which may even strongly vary from beamlet to beamlet. By applying a global PSF the resulting convoluted PSFs are sufficiently uniform so as to allow calculation of the resulting pattern on the target based on a uniform PSF, since the resulting PSF $P_{res}$ can be approximated with a Gaussian $p_G$ (using either the global PSF that enters the convolution and a Gaussian with a sigma increased by a suitable small value) without having to take into account the individual beamlet PSFs.

Referring again to FIG. 1, the global PSF is generated in a location generator lg. The signal of the location generator corresponds to a sequence of two-dimensional points in the X-Y-plane, centered around the origin. The actual location of the image goes through the different locations of this sequence very fast, in order to realize a PSF within each exposure step. Thus, in effect, the global PSF is realized by a high frequency modulation of the placement of beam array on the substrate. The range of this hf modulation corresponds to the sigma value of the global PSF and is applied to the patterned beam by through the deflectors 11 and/or 12. The deflectors 11, 12 may, as already mentioned, be realized as electrostatic deflectors in X and Y, preferably a multipole deflector, which are capable to expose the particle beam to a hf electric field according to the hf voltage applied. If required, analog adder means may be used as superposing device sd to superpose (by analog adding) the PSF signal to the other position control signals (used in connection with, e.g., pattern locking, substrate movement, etc.) of the control system 31. It is also possible to implement the deflector(s) providing the global PSF as components 12' which are distinct from the deflector components installed for other positioning control of the beam, for instance as a multipole deflector of its own arranged just before or after the last lens, as seen in the direction of the patterned particle beam.

The signal produced by the location generator lg is amplified using a fast amplifier system fa able to process the hf signal, and fed through a high-pass filter hpf which filters out all frequencies below a cut-off frequency. The amplification factor can be adjusted so the half-width of the distribution coincides with the desired value of $\sigma_G$. The cut-off frequency will be at least one order of magnitude, typically 1000 times, higher than the highest exposure frequency of the multi-beam processing apparatus. This frequency basically corresponds to the inverse of the exposure time.

For instance, for a smallest exposure time of 20 µs, which corresponds to 50 kHz, the cut-off frequency will be chosen to be above 0.5 MHz, for example 50 MHz. It should be noted that in a PML2 system the duration of an exposure step is preferably chosen such that the relative movement of the target covers a uniform distance of advance which is greater than the mutual distance of neighboring image elements on the target, in order to realize a complete coverage of the target field exposed. This corresponds to each nominal position of the image points, whereas the global PSF realizes a fast motion of the image around the nominal position, similar to a "Brownian" motion of a particle in a fluid, centered at its mean position.

As already mentioned, the location generator lg produces a distribution which approximates the mathematical two-dimensional Gaussian distribution. The location generator may, for instance by implemented using an analog source, namely a noise generator which covers a very large frequency range. Alternatively, a digital source may by used, with a digital function generator addressing either a quasi random position or rastering a fixed grid. In either case the distribution of the set of locations thus produced is such that it realizes a net dose distribution delivered to the substrate which substantially has the shape of a Gaussian, statistically centered around the origin (so that when superposed to the nominal image position, it centers around that position) and with a sigma which can be tuned so as to assume the selected value of $\sigma_G$.

Figure 8:
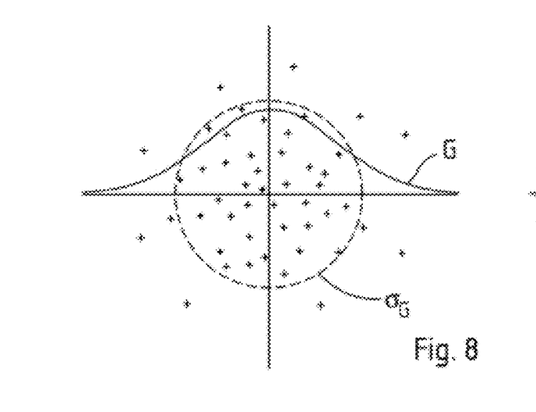
FIGS. 8 to 10 illustrate exemplary methods to realize a global PSF by variation of the actual image position around the nominal position, with FIG. 8 showing a density-controlled variation for a random-like set of positions, FIG. 9 likewise, but using on a regular, calculated collection of positions, and FIG. 10 showing a dose-controlled variation with positions on a regular grid.

FIG. 8 illustrates an example of a realization of a two-dimensional distribution by a set of points in the X-Y-plane. The density of the points (averaged for a given area element) approximates the Gaussian distribution G. The range of the parameter $\sigma_G$ is given as a dashed circle for reference. To realize the global PSF, the image is shifted from the origin by an amount as defined by a point in FIG. 7, and held at that point for a uniform fraction of the exposure time in order impart a uniform dose fraction to each point.

Figure 9:
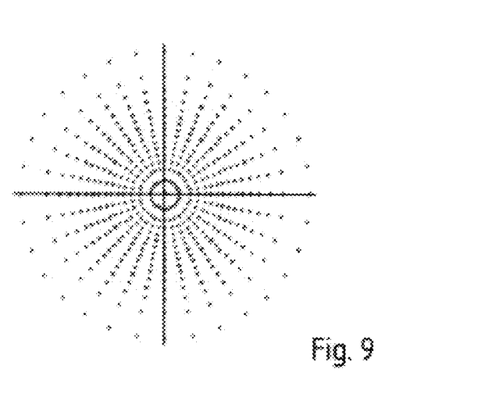

FIG. 9 shows a variant employing a set of points which are distributed in the X-Y-plane in a regular arrangement so as to emulate a Gaussian distribution. As one example, a circular (star-like) arrangement of points is depicted. It should be appreciated that due to the density of points in the innermost circle, the central point (at the origin) needs to be realized only once or can be omitted at all.

Figure 10:
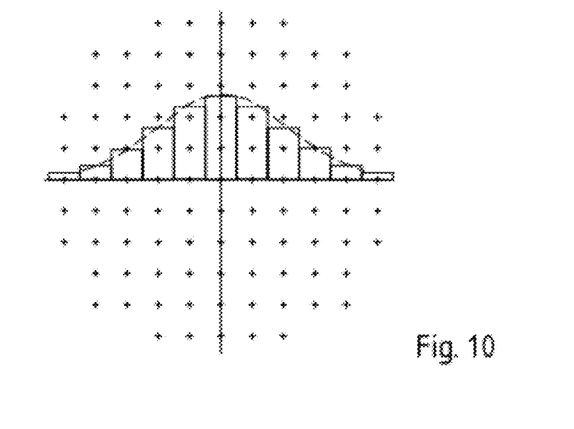

FIG. 10 illustrates another example, where the locations are on a regular grid, in this case an even rectangular grid. In this case, each point marked in FIG. 8 is addressed, and in order to realize the Gaussian distribution G, the time duration is varied accordingly. The histogram graph in FIG. 8 shows the time duration corresponding to the points on the X axis. It will be clear that the scale of the time duration is chosen such that the sum of the individual durations over all of the points of the regular grid corresponds to the duration of one exposure step.

The generation of the distribution is synchronized with the writing of the individual exposure steps in a manner ensuring that one sequence of locations starts at the beginning of one exposure step and the entire set of locations is executed within this one exposure step.

In a variant, the set of locations used for the global PSF may supplied from a positions list pl which comprises a sequence of locations in the X-Y-plane. Such a set of locations may be produced in advance so as to conform to a two-dimensional Gaussian around the origin. The list pl of positions may, e.g., realize a distribution having $\sigma_G=1$. The further processing of the signal, in particular amplification, adjustment by scale and superposition to the current nominal position, is then done as above.

From the above it will be obvious that it is important that the global PSF is well centered around zero. Furthermore, any noise related to the generation of the global PSF should be controlled in a way that the statistical variation of the center of the global PSF is zero or extremely small, in order to avoid spurious edge placement errors.

We claim:

1. A method for forming a pattern on a surface of a target by means of a beam of electrically charged particles, the method comprising:
   producing said particle beam;
   directing said particle beam through a pattern definition means producing a patterned particle beam comprising one or more beamlets;
   projecting said patterned particle beam by means of an optical column comprising at least one controllable deflection means onto said target surface to form, at a nominal location on the target, a beam image comprising the image of defining structures in the pattern definition means,
   moving, during a sequence of exposure steps, said beam image to different locations, respectively, by changing the nominal location of the beam image with respect to the target between exposure steps, and
   introducing, during an exposure step, a global point spread function uniform to all beamlets by varying the actual location of the beam image around the respective nominal location by means of said at least one controllable deflection means, through a set of locations comprising a distribution of locations within the image plane centering around a mean location coinciding with the nominal location, wherein said set of locations is generated using a location generator comprising a noise generator or other random generator, said location generator producing a sequence of locations in a plane centered around the origin of the plane, and said sequence is superposed to the current nominal position.

2. The method of claim 1, wherein said location generator comprises a digital generator producing a set of digital locations approximating a two-dimensional Gauss distribution.

3. The method of claim 1, wherein within the duration of an exposure step the relative movement of the target covers a uniform distance of advance which is greater than the mutual distance of neighboring image elements on the target.

4. The method of claim 1, wherein the set of locations comprises a substantially isotropic distribution of locations within the image plane centering around the mean location coinciding with the nominal location.

5. The method of claim 3, wherein the set of locations comprises a substantially isotropic distribution of locations within the image plane centering around the mean location coinciding with the nominal location.

6. The method of claim 1, wherein
   the target is moved relative to the pattern definition means along a scanning direction within an image plane in which the images of apertures are formed, and
   during each exposure step the nominal location of said beam image is, by means of said at least one controllable deflection means, moved along with the target, at least with respect to the relative target movement along the scanning direction, whereas between exposure steps the nominal location of the beam image is changed with respect to the target.

7. The method of claim 6, wherein
the step of directing said particle beam through a pattern definition means is performed using a pattern definition means comprising an aperture array having a plurality of regularly arranged apertures of identical shape, said step comprising producing a number of beamlets by means of said apertures which define the shape and relative position of said beamlets, and modifying selected beamlets by means of a blanking array means of the pattern definition means towards respective paths which do not meet the target, thus effectively switching off the passage of said selected beamlets, the remaining beamlets forming, as a whole, a patterned particle beam, wherein in the step of projecting the patterned particle beam onto said target surface, the beam image thus formed is composed of the images of the apertures whose beamlets are not switched off, with each aperture corresponding to an image element on the target surface, and wherein the sequence of exposure steps comprises a sequence of uniformly timed exposure steps.

8. The method of claim 3, wherein
the target is moved relative to the pattern definition means along a scanning direction within an image plane in which the images of apertures are formed, and
during each exposure step the nominal location of said beam image is, by means of said at least one controllable deflection means, moved along with the target, at least with respect to the relative target movement along the scanning direction, whereas between exposure steps the nominal location of the beam image is changed with respect to the target.

9. The method of claim 1, wherein the beam image is formed by said optical column, wherein the imaging by said optical column includes a local point spreading function, said local point spreading function having a common anisotropic component, and wherein the global point spread function comprises a non-isotropic global point spreading function, which superposes to the local point spreading function to compensate for said common anisotropic component of the local point spreading function.

10. The method of claim 1, wherein
the beam image is formed by said optical column, wherein the imaging by said optical column includes a local point spreading function, said local point spreading function varying over the beam image, the local point spread function further having an anisotropy, and
wherein the global point spread function comprises an isotropic global point spreading function, which superposes to the local point spreading function to obtain a combined point spreading function having reduced anisotropy.

* * * * *